(12) United States Patent
Amer

(10) Patent No.: US 10,521,547 B2
(45) Date of Patent: Dec. 31, 2019

(54) COVERGROUP NETWORK ANALYSIS

(71) Applicant: Mentor Graphics Corporation, Wilsonville, OR (US)

(72) Inventor: Mennatallah Amer, Cairo (EG)

(73) Assignee: Mentor Graphics Corporation, Wilsonville, OR (US)

( * ) Notice: Subject to any disclaimer, the term of this patent is extended or adjusted under 35 U.S.C. 154(b) by 112 days.

(21) Appl. No.: 15/885,142

(22) Filed: Jan. 31, 2018

(65) Prior Publication Data

US 2019/0121932 A1   Apr. 25, 2019

Related U.S. Application Data

(60) Provisional application No. 62/575,186, filed on Oct. 20, 2017.

(51) Int. Cl.
*G06F 17/50* (2006.01)
*G06T 11/20* (2006.01)
*G06F 16/332* (2019.01)

(52) U.S. Cl.
CPC ...... *G06F 17/5081* (2013.01); *G06F 17/5036* (2013.01); *G06F 17/5086* (2013.01); *G06T 11/206* (2013.01); *G06F 16/3328* (2019.01)

(58) Field of Classification Search
CPC ............. G06F 17/5081; G06F 17/5086; G06F 17/5036; G06F 16/3328; G06T 11/206

USPC .......................... 716/106–108, 111–113, 136
See application file for complete search history.

(56) References Cited

U.S. PATENT DOCUMENTS

| | | | | |
|---|---|---|---|---|
| 6,654,715 B1* | 11/2003 | Iwashita | ............... | G06F 17/504 703/14 |
| 2015/0302133 A1* | 10/2015 | Ikram | ................. | G06F 17/5045 716/111 |

* cited by examiner

*Primary Examiner* — Nghia M Doan
(74) *Attorney, Agent, or Firm* — Mentor Graphics Corporation

(57) ABSTRACT

This application discloses performing functional verification on a circuit design describing an electronic device and a computing system to determine occurrences of coverpoints and coverage crosses within a covergroup based on the results of the functional verification of the circuit design. Each coverpoint corresponds to a signal state or a variable value in the circuit design during the functional verification. Each of the coverage crosses corresponds to a different plurality of the coverpoints occurring concurrently. The computing system can generate a graphical presentation of the covergroup. The graphical presentation include nodes, each of which corresponding to the coverpoints or the coverage crosses. The nodes can be arranged in the graphical presentation based on connectivity between the coverpoints and the coverage crosses and clustered in the graphical presentation based on the occurrences of the coverpoints and coverage crosses during the functional verification of the circuit design.

20 Claims, 7 Drawing Sheets

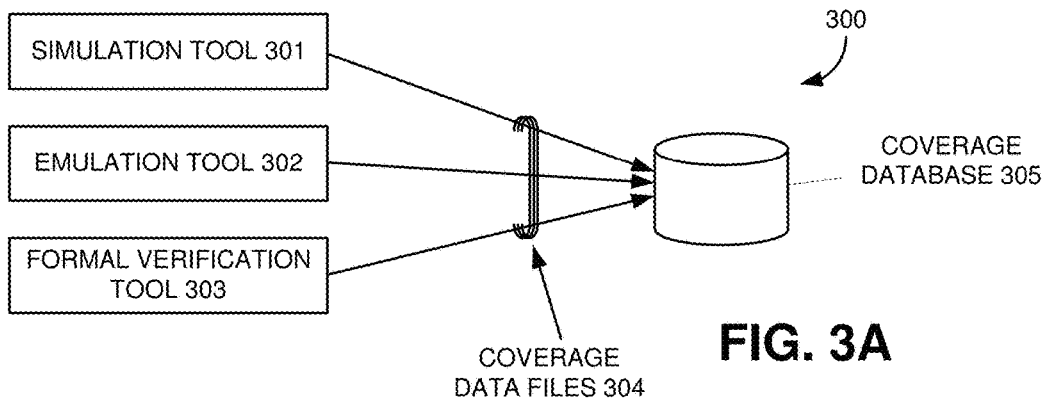
FIG. 3A
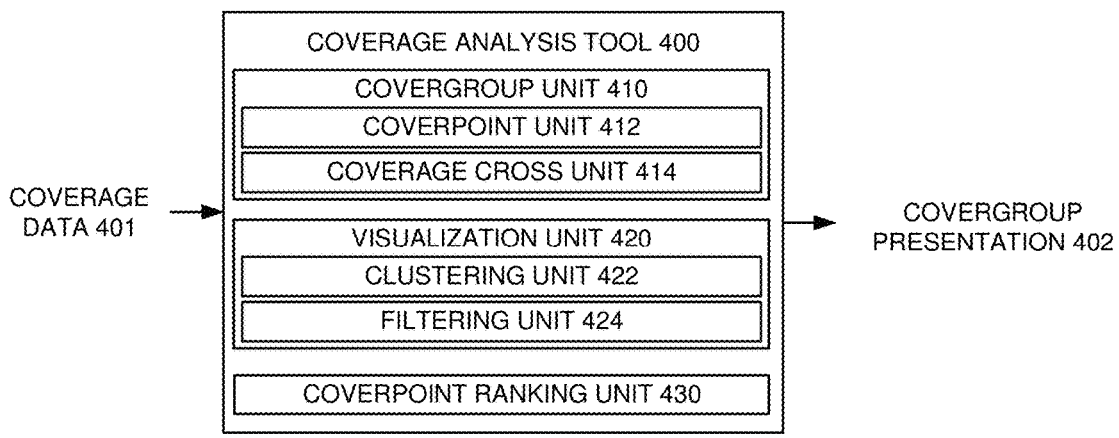
FIG. 4
| FIRST COVERPOINT 501 | |
|---|---|
| BIN | HIGH |
| BIN | LOW |
| SECOND COVERPOINT 502 | |
|---|---|
| BIN | 0 |
| BIN | 1 |
| COVERAGE CROSSES 503 | |
|---|---|
| BIN | HIGH + 0 |
| BIN | HIGH + 1 |
| BIN | LOW + 0 |
| BIN | LOW + 1 |
FIG. 5

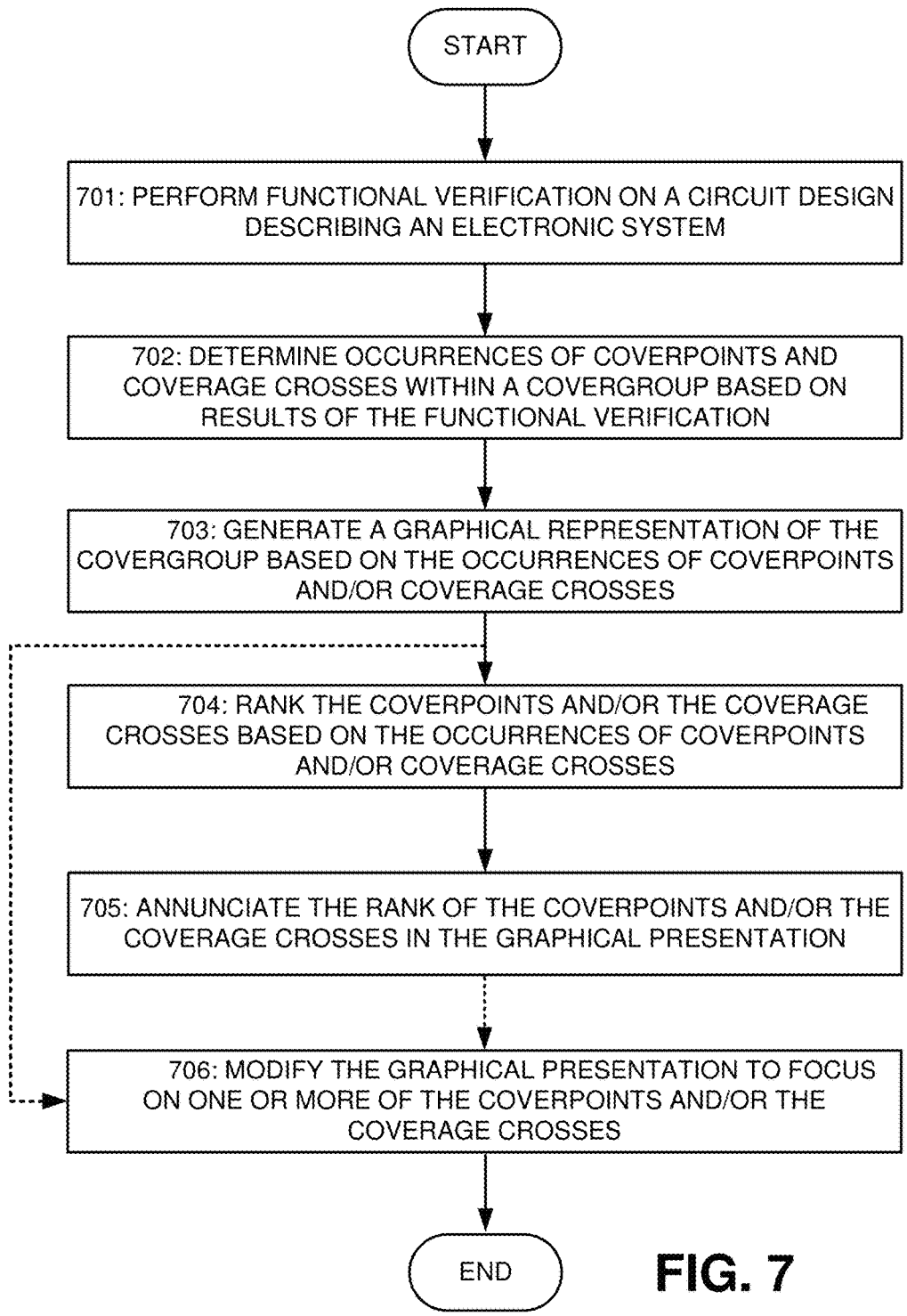

COVERGROUP NETWORK ANALYSIS

RELATED APPLICATION

This patent application claims priority to U.S. Provisional Patent Application No. 62/575,186, filed Oct. 20, 2017, which is incorporated by reference herein.

TECHNICAL FIELD

This application is generally related to electronic design automation and, more specifically, to covergroup network analysis for design verification technology.

BACKGROUND

Designing and fabricating electronic systems typically involves many steps, known as a "design flow." The particular steps of a design flow often are dependent upon the type of electronic system to be manufactured, its complexity, the design team, and the fabricator or foundry that will manufacture the electronic system from a design. Typically, software and hardware "tools" verify the design at various stages of the design flow by running simulators and/or hardware emulators, or by utilizing formal techniques, allowing any errors in the design discovered during the verification process to be corrected.

Initially, a specification for a new electronic system can be transformed into a logical design, sometimes referred to as a register transfer level (RTL) description of the electronic system. With this logical design, the electronic system can be described in terms of both the exchange of signals between hardware registers and the logical operations that can be performed on those signals. The logical design typically employs a Hardware Design Language (HDL), such as System Verilog or Very high speed integrated circuit Hardware Design Language (VHDL).

The logic of the electronic system can be analyzed to confirm that it will accurately perform the functions desired for the electronic system, sometimes referred to as "functional verification." A design verification tool can perform functional verification operations, such as simulating, emulating, and/or formally verifying the logical design. For example, when the design verification tool simulates the logical design, the design verification tool can provide transactions or sets of test vectors, for example, generated by a simulated test bench, to the simulated logical design. The design verification tool can determine how the simulated logical design responded to the transactions or test vectors, and verify, from that response, that the logical design describes circuitry to accurately perform functions.

The design verification tool also can quantify how well the test vectors input to a logical design under verification came to covering or adequately exercising the logical design. Traditional techniques to determine coverage of the logical design include code coverage and functional coverage. Code coverage, such as statement coverage, branch coverage, decision coverage, condition coverage, expression coverage, toggle coverage, or the like, can identify which lines, statements, expressions, decisions, or toggles of the logical design were exercised by the test bench during verification operations. Functional coverage can quantify how well the logical design had its functionality exercised during verification operations.

Functional coverage has gained widespread popularity among verification engineers due to its ability to allow the engineers to focus on aspects of system level design, such as coverage of a covergroup. The covergroup can define multiple coverpoints, such as particular signal states or particular variable values occurring during verification operations, and define coverage crosses, such as a plurality of the coverpoints in the covergroup occurring at the same time. The design verification tool can quantify coverage for the covergroup and, for example, report a list of the coverpoints and the coverage crosses that contribute to coverage of the covergroup.

Verification engineers seeking to increase coverage of the covergroup typically utilize the list to ascertain uncovered or lightly covered coverpoints and coverage crosses and then develop new test vectors that attempt to cover some of those coverpoints and coverage crosses. The decision on which of the uncovered or lightly covered coverpoints and coverage crosses to target with the new test vectors remains dependent on intuition of the verification engineers. This process can iterate until the verification engineers have generated enough sets of test vectors to achieve coverage closure for the covergroup.

SUMMARY

This application discloses performing functional verification on a circuit design describing an electronic device and a computing system to determine occurrences of coverpoints and coverage crosses within a covergroup based on the results of the functional verification of the circuit design. Each coverpoint corresponds to a signal state or a variable value in the circuit design during the functional verification. Each of the coverage crosses corresponds to a different plurality of the coverpoints occurring concurrently. The computing system can generate a graphical presentation of the covergroup. The graphical presentation include nodes, each of which corresponding to the coverpoints or the coverage crosses. The nodes can be arranged in the graphical presentation based on connectivity between the coverpoints and the coverage crosses and clustered in the graphical presentation based on the occurrences of the coverpoints and coverage crosses during the functional verification of the circuit design. Embodiments will be described in greater detail below.

DESCRIPTION OF THE DRAWINGS

FIGS. 3A and 3B illustrate an example coverage data system storing coverage data from multiple verification tools that may be implemented according to various embodiments.

FIG. 4 illustrates an example covergroup analysis tool to generate covergroup presentations, which may be implemented according to various embodiments.

FIG. 5 illustrates an example coverpoint bins and coverage cross bins according to various examples.

FIG. 7 illustrates an example flowchart implementing covergroup network analysis which may be implemented according to various embodiments.

DETAILED DESCRIPTION

Illustrative Operating Environment

Figure 1:
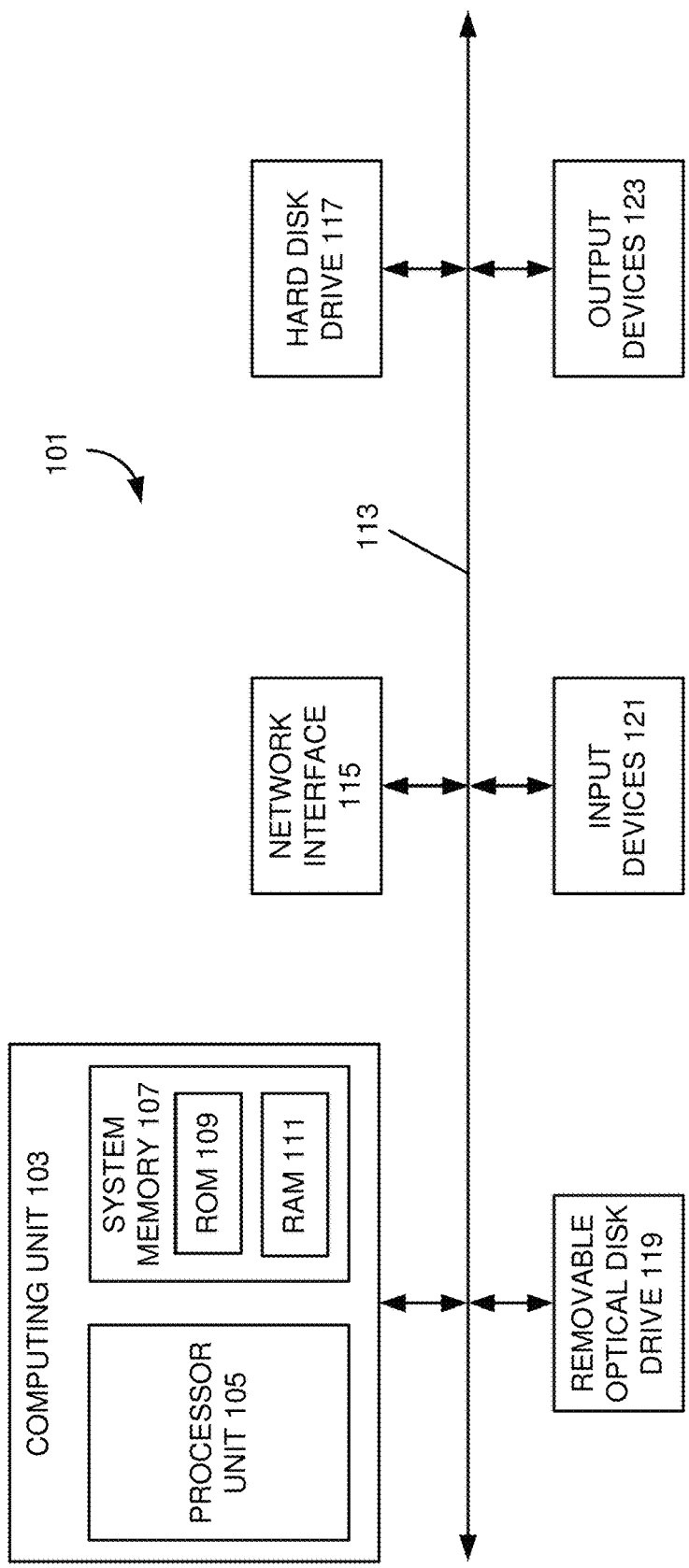
FIGS. 1 and 2 illustrate an example of a computer system of the type that may be used to implement various embodiments.

Various embodiments may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 117-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 117-123 may be internally housed with the computing unit 103. Alternately, one or more of the peripheral devices 117-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
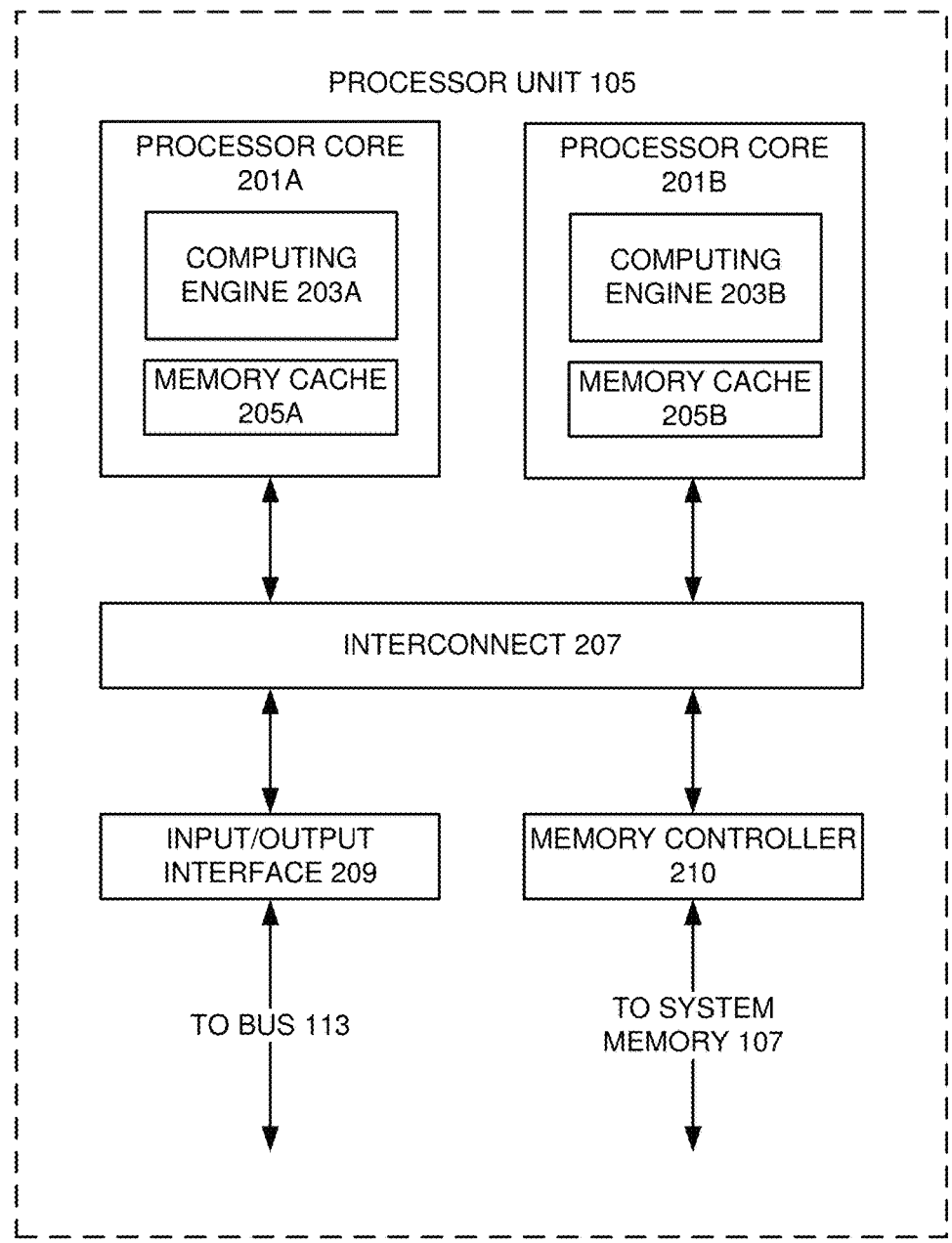

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Example Verification Environment

Figure 3B:
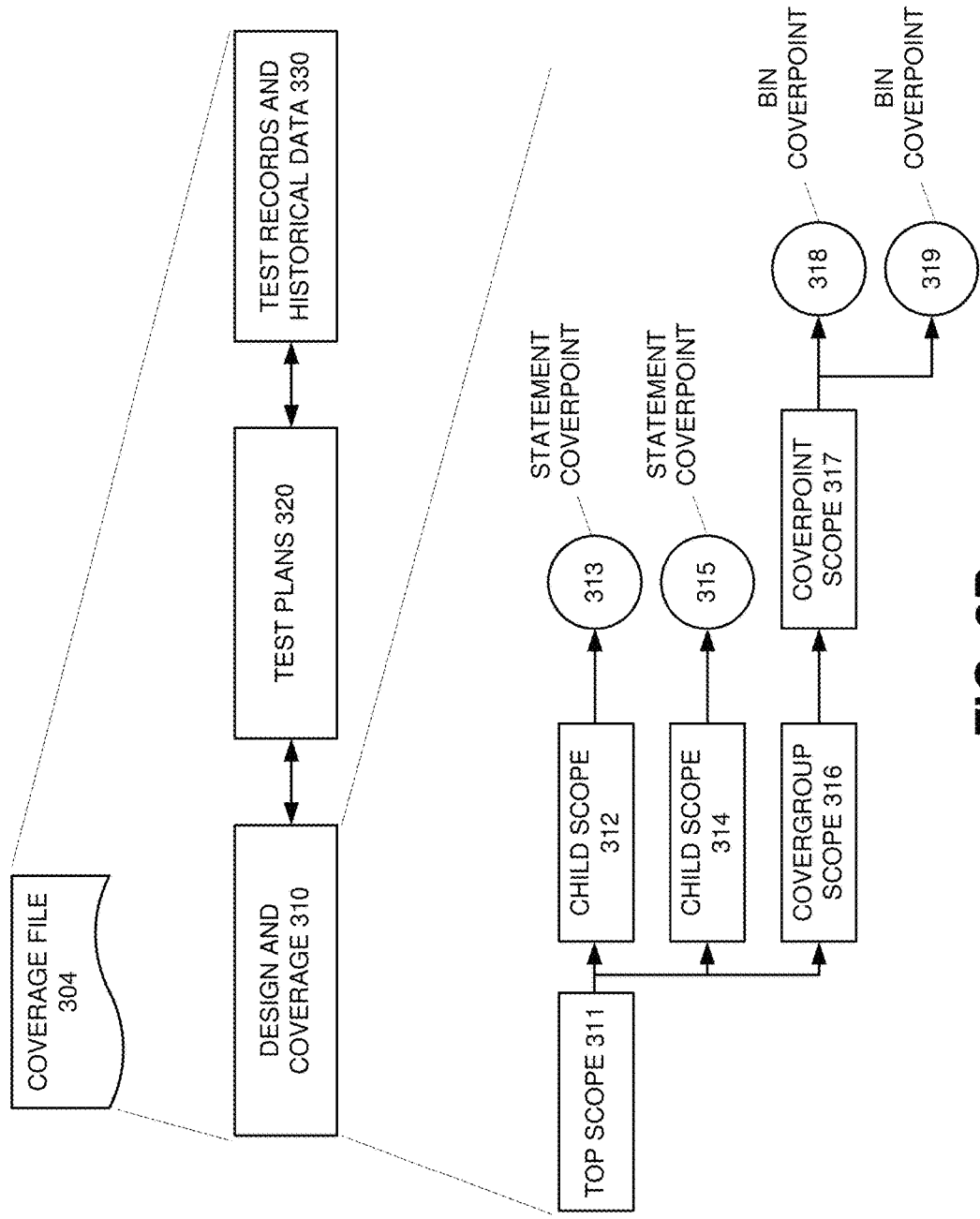

FIGS. 3A and 3B illustrate an example coverage data system 300 storing coverage data from multiple verification tools that may be implemented according to various embodiments. Referring to FIG. 3A, the coverage data system 300 can include multiple verification tools, such as a simulation tool 301, an emulation tool 302, a formal verification tool 303, or the like, to functionally verify an electronic design described by a circuit design and generate coverage data files 304 for storage in a coverage database 305. In some embodiments, the circuit design can describe the electronic device both in terms of an exchange of data signals between components in the electronic device, such as hardware registers, flip-flops, combinational logic, or the like, and in terms of logical operations that can be performed on the data signals in the electronic device. The circuit design can model the electronic device at a register transfer level (RTL), for example, with code in a hardware description language (HDL), such as Very high speed integrated circuit Hardware Design Language (VHDL), System C, or the like. In some embodiments, the verification tools can receive the circuit design from a source external to the verification tools, such as a user interface of the computer network 101, another tool implemented by the computer network 101, or one or more of the verification tools may generate the circuit design internally.

The simulation tool 301 and the emulation tool 302 can respectively simulate or emulate a test bench and a design under verification, such as the circuit design. The emulation tool 302 can perform functional verification with one or more hardware emulators configured to emulate the design under verification. The simulation tool 301 can implement the design verification tool with one or more processors configured to simulate the design under verification.

The test bench, during simulation or emulation, can generate test stimulus, for example, clock signals, activation signals, power signals, control signals, and data signals that, when grouped, may form test bench transactions capable of prompting operation of the design under verification. In some embodiments, the test bench can be written in an object-oriented programming language, for example, SystemVerilog or the like, which, when executed during elaboration, can dynamically generate test bench components for verification of the circuit design. A methodology library, for example, a Universal Verification Methodology (UVM) library, an Open Verification Methodology (OVM) library, an Advanced Verification Methodology (AVM) library, a Verification Methodology Manual (VMM) library, or the like, can be utilized as a base for creating the test bench. The simulated or emulated design under verification, in response to the test stimuli, can generate output, which can be compared to expected output of the design under verification in response to the test stimuli by the simulation tool 301 or the emulation tool 302.

The formal verification tool 303 can analyze the circuit design in an attempt to functionally verify portions of the circuit design. In some embodiments, the formal verification tool 303 can utilize one or more formal techniques, such as a Binary Decision Diagram (BDD), a Boolean Satisfiability (SAT) Solver, an Automatic Test Pattern Generator (ATPG), Cut Point Prover, or the like, in an attempt to prove or disprove functionality of circuit design. The formal verification tool 303 also can utilize static design checking functionality, such as a clock domain crossing check, a reset domain check, a power domain check, or the like, which can be utilized in an attempt to functionally verify portions of the circuit design.

The design verification tools also can record coverage events that occurred during simulation, emulation, or the like, which can identify how well the test stimulus exercised the functionality of the circuit design. For example, the verification tools can record information, such as a hierarchy of the design under verification, a test plan that includes the test bench or other test information, results of the verification operations, and coverage information, such as code coverage or functional coverage. The coverage information can identify how well verification operations, such as simulation, emulation, and/or formal verification, came to covering or adequately exercising the circuit design under verification. In some embodiments, code coverage, such as statement coverage, branch coverage, decision coverage, condition coverage, expression coverage, toggle coverage, or the like, can identify which lines, statements, expressions, decisions, or toggles of the circuit design were exercised by the test bench during verification operations, while functional coverage can quantify how well a circuit design had its functionality exercised during verification operations. In some embodiments, the recorded coverage events can correspond to covergroups, which can be a group of coverpoints, such as states of signals or values of variables in the circuit design under verification. The covergroups also can include coverage crosses, which can be a combination of two or more coverpoints occurring concurrently, contemporaneously, at the same time, or approximately at the same time during simulation, emulation, or the like.

The design verification tools can utilize the recorded information to generate coverage data files 304 that can conform to a coverage data model. In some embodiments, the coverage data files 304 generated by the design verification tools can be compliant with a Unified Coverage Interoperability Standard (UCIS), which defines features a coverage data model is to include in order to be standard-compatible. The design verification tools can store the coverage data files 304 into a coverage database 305. In some embodiments, the coverage database 305 can be compliant with the UCIS, meaning it supports coverage data files 304 having standard-compatible coverage data models.

Referring to FIG. 3B, an example of the coverage data file 304 is shown. The coverage data file can include multiple sections, including a design and coverage section 310, a test plan section 320, and a test records and historical data section 330. The design and coverage design section 310 can include data corresponding to a design under verification, such as a hierarchical representation of the circuit design having undergone verification operations by the multiple design verification tools. The design and coverage design section 310 also can include data corresponding to coverage of the circuit design during the verification operations. The test plan section 320 can include information associated with one or more test plans of the verification operations. The test records and historical data section 330 can include information on tests or regressions run on the circuit design during the verification operations. Data from the sections 310-330 can be linked to each other in the coverage database 305.

The coverage portion of the design and coverage design section 310 can be structured or arranged hierarchically according to the UCIS, for example, having basic building blocks of scopes and cover points. An example of the coverage portion of the design and coverage design section 310 can include multiple cover points, such as statement cover points 313 and 315, and bin cover points 318 and 319. The UCIS cover points can be constructs having an integral count annotated with information, such as name, type, attributes, or the like, corresponding to what was counted. The cover points 313, 315, 318, and 319 can be organized by a hierarchy of scopes. In this example, the coverage portion of the design and coverage design section 310 can include a top scope 311 having two child scopes 312 and 314 and a covergroup scope 316. The child scope 312 can have the statement cover point 313, while child scope 314 can have cover point 315. The covergroup scope 316 can have another scope below it in the hierarchy of scopes, namely, a cover point scope 317. The cover point scope 317 can have bin cover points 318 and 319.

Covergroup Network Analysis

FIG. 4 illustrates an example coverage analysis tool 400 to generate covergroup presentations, which may be implemented according to various embodiments. Referring to FIG. 4, the coverage analysis tool 400 can receive coverage data 401, such as one or more coverage data files, for example, stored in a coverage database. The coverage data 401 can include records of coverage events, such as coverpoints and coverage crosses, which occurred during simulation, emulation, or the like of a circuit design. A verification engineer can review the recorded coverage events to identify holes or gaps in coverage, and generate new test benches that can attempt to exercise the functionality in the circuit design differently to fill the holes or gaps in the coverage.

The coverage analysis tool 400 can include a covergroup unit 410 to identify a network of coverpoints and coverage crosses in a covergroup. The covergroup network unit 410 can identify connectivity of the coverpoints and the coverage crosses in the covergroup. For example, since a coverage cross in the covergroup can correspond to multiple coverpoints occurring at the same time, the covergroup network unit 410 can determine the multiple coverpoints have connectivity to each other via the coverage cross.

The covergroup unit 410 can include a coverpoint unit 412 to utilize the coverage data 401 to identify the coverpoints for the covergroup and to determine occurrences of the coverpoints during functional verification of the circuit design describing the electronic device. In some embodiments, the coverpoint unit 412 can identify bins corresponding to the coverpoints in the coverage data 401 and determine whether the coverpoints occurred during the functional verification based on the information associated with the bins. A coverpoint can occur during the functional verification when a signal or a variable associated with the coverpoint was set to a particular state or value. The coverpoint unit 412 also can ascertain a number of times the coverpoints occurred during the functional verification.

The covergroup parsing unit 410 can include a coverage cross unit 414 can utilize the coverage data 401 to identify coverage crosses included in the covergroup and to determine occurrences of the coverage crosses during functional verification of the circuit design describing the electronic device.

In some embodiments, the coverage cross unit 414 can identify bins corresponding to the coverage crosses in the coverage data 401 and determine whether the coverage crosses occurred during the functional verification based on the information associated with the bins. A coverage cross can occur during the functional verification when multiple coverpoints occurred at the same time during the functional verification. The coverage cross unit 414 also can ascertain a number of times the coverpoints occurred during the functional verification. Embodiments of example coverpoints and coverage crosses in the coverage data 401 will be described below with reference to FIG. 5.

FIG. 5 illustrates an example coverpoint bins and coverage cross bins according to various examples. Referring to FIG. 5, a first coverpoint 501 can correspond to a particular signal in a design under verification, such as a circuit design describing an electronic device. The first coverpoint 501 can include multiple bins, each corresponding to a different signal state, such as a "high" state and a "low" state. During functional verification of the circuit design, a design verification tool, such as a simulator or an emulator, can identify states of the signal associated with the first coverpoint 501 and increment counters in corresponding bins based on the identified states. For example, when the design verification tool determines the signal associated with the first coverpoint 501 enters a "high" state, the design verification tool can increment the counter associated with the "high" signal state for the first coverpoint 501.

A second coverpoint 502 can correspond to a particular variable in the design under verification. The second coverpoint 502 can include multiple bins, each corresponding to a different variable value, such as a "0" value and a "1" value. During functional verification of the circuit design, the design verification tool can identify values of the variable associated with the second coverpoint 502 and increment counters in corresponding bins based on the identified values. For example, when the design verification tool determines the variable associated with the second coverpoint 502 becomes set to a "1" value, the design verification tool can increment the counter associated with the "1" value for the second coverpoint 502.

Coverage crosses 503 can correspond to a combination of the first coverpoint 501 and the second coverpoint 502 occurring at the same time during functional verification of the circuit. The coverage crosses 503 can include multiple bins, each corresponding to a different combination of the first coverpoint 501 and the second coverpoint 502. For example, the coverage crosses 503 can have a bin corresponding to concurrent occurrence of a "high" signal state of the first coverpoint 501 and a "0" value of the second coverpoint 502, a bin corresponding to concurrent occurrence of a "high" signal state of the first coverpoint 501 and a "1" value of the second coverpoint 502, a bin corresponding to concurrent occurrence of a "low" signal state of the first coverpoint 501 and a "0" value of the second coverpoint 502, and a bin corresponding to concurrent occurrence of a "low" signal state of the first coverpoint 501 and a "1" value of the second coverpoint 502. During functional verification of the circuit design, the design verification tool can identify states of the signal associated with the first coverpoint 501 and identify values of the variable associated with the second coverpoint 502, and increment counters in corresponding bins when the identified states and values occur concurrently.

Referring back to FIG. 4, the coverage analysis tool 400 can include a visualization unit 420 to generate a graphical presentation of the covergroup or a covergroup presentation 402, which can be displayed, for example, by the computing device 101. The covergroup presentation 402 can include nodes corresponding to the coverpoints and the coverage crosses and include edges or lines to identify relationships between the nodes. In some embodiments, the visualization unit 420 can annunciate characteristics of the nodes in the covergroup presentation 402. For example, the visualization unit 420 can set node shape in the covergroup presentation 402 based on a type of element in the covergroup represented by the node, such as circular nodes for coverpoints and square nodes for coverage crosses. In another example, the visualization unit 420 can set a color of the nodes in the covergroup presentation 402 based on coverage levels of the coverpoints and the coverage crosses represented by the nodes.

The visualization unit 420 can include a clustering unit 422 to generate the covergroup presentation 402 using a force-directed graphing functionality, which can set locations of the nodes relative to each other in the covergroup presentation 402 based, at least in part, on a number of coverage crosses that a coverpoint contributes, relationships between coverpoints and coverage crosses, or the like. In some embodiments, the force-directed graph can set forces for the nodes based on relationships between the coverpoints and the coverage crosses, for example, repulsion forces and attraction forces, and then utilize the forces to determine the locations of the nodes in the covergroup presentation 402. This settling of the forces by the force-directed graphing functionality can cluster nodes in the covergroup presentation 402 based, at least in part, on the interrelationships between the coverpoints and coverage crosses.

The visualization unit 420 can include a filtering unit 424 to modify the covergroup presentation 402, for example, to remove certain nodes from the covergroup presentation 402 or focus on a section of the covergroup presentation 402. In some embodiments, the filtering unit 424 can identify a target node to utilize as a starting point for filtering operations. The filtering unit 424 may identify the target node via user input, based on an internal ranking by the coverage analysis tool 400, or the like.

The filtering unit 424 can identify neighboring nodes to the target node and generate a presentation to include the target node and the neighboring nodes. In some embodiments, the filtering unit 424 can identify neighboring nodes as a set of nodes directly coupled to the target node, a set of nodes coupled to the target node directly or through a number of intermediate nodes, or the like. The filtering unit 424 can selectively remove the identified neighboring nodes based on a variety of factors, such as coverage, cardinality or how many other nodes the neighboring node couples with, or the like. Embodiments of example graphical presentations of the covergroup will be described below with reference to FIGS. 6A and 6B. The filtering unit 424 also can identify nodes in the covergroup presentation 402 based on characteristics of the nodes. For example, filtering unit 424 can identify nodes having a coverage level below a threshold coverage level, and the covergroup presentation 402 can display the identified nodes, optionally, along with one or more neighboring nodes to the identified nodes.

Figure 6A:
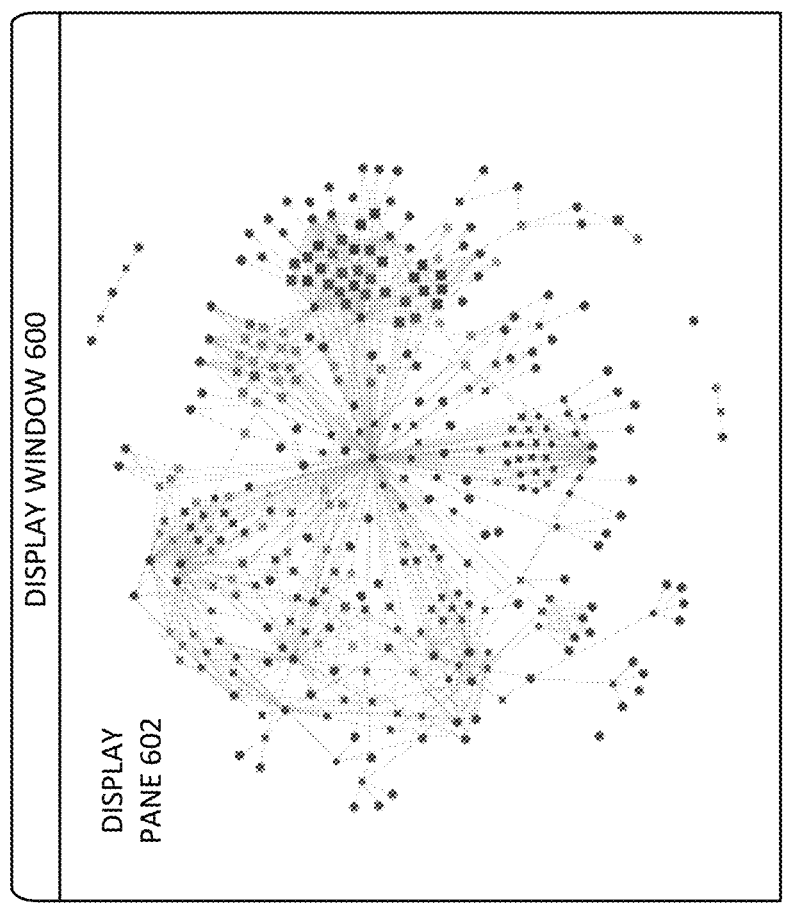
FIGS. 6A and 6B illustrate example graphical representations of covergroups using a force-directed graph, which can model relationship between coverpoints and coverage crosses in the covergroups according to various examples.
Figure 6B:
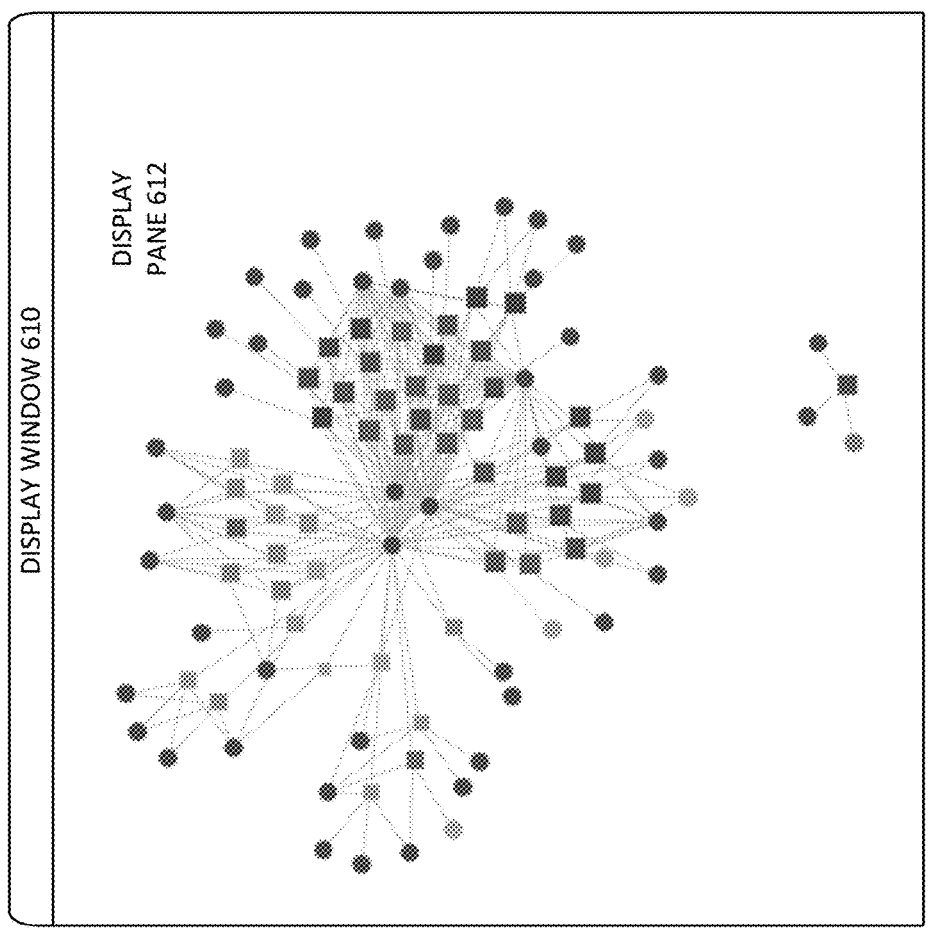

FIGS. 6A and 6B illustrate example graphical presentations of covergroups using a force-directed graph, which can model relationship between coverpoints and coverage crosses in the covergroups according to various examples. Referring to FIG. 6A, a display window 600 for a covergroup analysis tool can include a display pane 602 capable of displaying a graphical presentation of a covergroup.

The graphical presentation of the covergroup can include nodes arranged to pictorially present interrelationships between the elements in the covergroup, i.e., the coverpoints and the coverage crosses. The graphical presentation of the covergroup also can include edges, shown as lines between the nodes, to identify relationships between the nodes. In some embodiments, the graphical presentation of the covergroup can be a two-dimensional or a three-dimensional presentation, which can show coverpoints and coverage crosses from coverage data relative to each other.

The graphical presentation of the covergroup can annunciate characteristics of the elements of the covergroup, for example, by altering the visual presentation of the nodes or the edges. In some examples, the graphical presentation of the covergroup can set shapes of the nodes based on elements types in the covergroup, such as circular nodes for coverpoints and square nodes for coverage crosses. In another example, the graphical presentation of the covergroup can set colors of the nodes based on coverage levels of the coverpoints and the coverage crosses represented by the nodes. The graphical presentation of the covergroup also may adjust a size of the node relative to other nodes based on a coverage of the coverpoints and/or coverage crosses, cardinality of the coverpoints and/or coverage crosses, the interrelationships to coverpoints and/or coverage crosses, or the like.

In the instant example, graphical presentation of the covergroup have cluster nodes, for example, generated by force-directed graphing functionality, which can set locations of the nodes relative to each other in the graphical presentation of the covergroup based, at least in part, on a number of coverage crosses that a coverpoint contributes, relationships between coverpoints and coverage crosses, or the like.

Referring to FIG. 6B, a display window 610 for a covergroup analysis tool can include a display pane 612 capable of displaying a filtered presentation of a covergroup. In some embodiments, the filtered presentation of the covergroup can be a two-dimensional or a three-dimensional presentation, which can show coverpoints and coverage crosses from coverage data relative to each other. In the instant example, the filtered presentation of the covergroup can correspond to a subset of the nodes in the graphical presentation shown in FIG. 6A. As discussed above, a coverage analysis tool can generate the filtered presentation of the covergroup by identifying nodes in the covergroup having a coverage level below a threshold level, and then presenting the identified nodes along with the neighboring nodes coupled to the identified nodes.

In this example, the filtered graphical presentation of the covergroup illustrates coverage crosses in the covergroup having a coverage level below 50% coverage, and also illustrates the coverpoints that couple to those coverage crosses. The coverage analysis tool can generate the filtered graphical presentation of the covergroup by identifying nodes in the covergroup having less than 50% coverage, which, in this example, corresponds to some of the coverage crosses in the covergroup, identifying the nodes coupled to the identifying nodes, and then altering the covergroup presentation to include the nodes identified by the coverage analysis tool.

The coverage analysis tool can generate the filtered presentation of the covergroup as a force-directed graph with locations of the nodes represented forces and the edges can be used to simulate the natural motion of the nodes to reach a state of low energy potential. In some embodiments, opposing forces can be repulsive charge-like forces between the nodes and attractive spring-like forces in the edges. The nodes also can form clusters that mutually repel other clusters. Although FIGS. 6A and 6B show specific types of node annotation or alterations capable of graphically annunciating characteristics of associated with the nodes, in some embodiments, other node annotation or alterations may be utilized to graphically or textually annunciate characteristics of associated with the nodes.

Referring back to FIG. 4, the coverage analysis tool 400 can include a covergroup ranking unit 430 to rank the coverpoints and/or the coverage crosses, which may be annunciated in the covergroup presentation 402, for example, by altering the size of the node in covergroup presentation 402.

In some embodiments, the covergroup ranking unit 430 can rank the coverpoints based, at least in part, on Equation 1.

$$\text{Coverpoint Rank} = (\text{Cov\_cvp} + w\_i * \text{Cov\_i})/(w\_i + 1) \quad \text{Equation 1}$$

The coverpoint rank can correspond to a coverage of the coverpoint (Cov_cvp) added to a coverage of coverage crosses (Cov_i) coupled to the coverpoint multiplied by a weight of those coverage crosses (w_i), all of which can be divided by 1 added to the weight of those coverage crosses (w_i). This calculation of coverpoint rank takes into account the coverage of the coverpoint as well as favoring coverpoints having many neighbors by lowering the coverpoint rank. Since coverage of coverpoints is usually higher than the coverage of coverage crosses, adding coverage of coverage crosses would reduce the coverpoint rank for coverpoints having more connections to coverage crosses, as the denominator would be larger. The cover cross ranking can be associated with the average of the ranking of its coverpoints. A lower ranking may indicate that the coverpoint and/or the coverage cross could be lightly covered relative to the degree of cardinality associated with the coverpoint or the coverage cross. The coverpoint ranking unit 430 can provide the coverpoint rank and/or the coverage cross rank to the visualization unit 420, and the visualization unit 420 can annunciate the ranks in the covergroup presentation 402 or utilize the ranks during filtering operations.

FIG. 7 illustrates an example flowchart implementing a covergroup network analysis which may be implemented according to various embodiments. Referring to FIG. 7, in a block 701, a design verification system can perform functional verification on a circuit design describing an electronic system. In some embodiments, the design verification system an include multiple verification tools, such as a simulator, an emulator, a formal verification tool, or the like, to functionally verify the electronic design described by the circuit design. The design verification system can record coverage events that occurred during simulation, emulation, or the like, which can identify how well test stimulus exercised the functionality of the circuit design during the functional verification. Some of the recorded coverage events can correspond to covergroups, which can be a group of coverpoints, such as states of signals or values of variables in the circuit design under verification, and a group of coverage crosses, which can be a combination of two or more coverpoints occurring concurrently.

In a block 702, the computing system implementing the covergroup analysis tool can determine occurrences of coverpoints and coverage crosses within a covergroup based on results of the functional verification. In some embodiments, the computing system implementing the covergroup analysis tool can identify bins corresponding to the coverpoints and/or coverage crosses in the results of the functional verification and determine whether the coverpoints and/or coverage crosses occurred during the functional verification based on the information associated with the bins. The computing system implementing the covergroup analysis tool also can ascertain a number of times the coverpoints and/or coverage crosses occurred during the functional verification.

In a block 703, the computing system implementing the covergroup analysis tool can generate a graphical representation of the covergroup based on the occurrences of coverpoints and/or coverage crosses. The graphical representation of the covergroup can be a force-directed graph having nodes corresponding to the coverpoints and the coverage crosses and include edges or lines to identify relationships between the nodes. In some embodiments, the computing system implementing the covergroup analysis tool can annunciate characteristics of the nodes in the graphical representation of the covergroup. For example, the computing system implementing the covergroup analysis tool can set node shape in the graphical representation of the covergroup based on a type of element in the covergroup represented by the node, such as circular nodes for coverpoints and square nodes for coverage crosses. In another example, the computing system implementing the covergroup analysis tool can set a color of the nodes in the graphical representation of the covergroup based on coverage levels of the coverpoints and the coverage crosses represented by the nodes.

In some embodiments, the computing system implementing the covergroup analysis tool can generate graphical representation for a subset of the covergroup. For example, the computing system implementing the covergroup analysis tool can generate graphical representation for a subset of the covergroup by removing certain nodes from the graphical presentation of the covergroup or trimming the graphical presentation of the covergroup. In another example, the computing system implementing the covergroup analysis tool can selectively build the graphical presentation of the subset of the covergroup based on the coverpoints and the coverage crosses in the covergroup.

In a block 704, the computing system implementing the covergroup analysis tool can rank the coverpoints and/or the coverage crosses based on the occurrences of coverpoints and/or coverage crosses.

In a block 705, the computing system implementing the covergroup analysis tool can annunciate the rank of the coverpoints and/or the coverage crosses in the graphical presentation. The computing system implementing the covergroup analysis tool can rank the coverpoints based, at least in part, on a coverage of the coverpoints and which coverage crosses the coverpoints couple with or contribute. The computing system implementing the covergroup analysis tool can rank the coverage crosses based, at least in part, on rankings of the coverpoints contributing to the coverage crosses. The rankings may provide an indication of which nodes within the covergroup may be uncovered, lightly covered, or more interrelated to other nodes, which may aid verification engineers in generating new test stimulus for functional verification of the circuit design.

In a block 706, the computing system implementing the covergroup analysis tool can modify the graphical presentation to focus on one or more of the coverpoints and/or the coverage crosses. In some embodiments, the computing system implementing the covergroup analysis tool can annunciate the rank of the nodes, for example, by altering the size of the node in graphical presentation of the covergroup. The computing system implementing the covergroup analysis tool may highlight connectivity via edges connecting the nodes to annunciate a target coverpoint or coverage cross, a cluster of nodes, or the like.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while some of the specific terminology has been employed above to refer to electronic design automation processes, it should be appreciated that various examples may be implemented using any electronic system.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
    performing functional verification on a circuit design describing an electronic device;
    based on the results of the functional verification of the circuit design, determining, by a computing system, occurrences of coverpoints within a covergroup, wherein each coverpoint corresponds to a signal state or a variable value in the circuit design during the functional verification; and
    generating, by the computing system, a graphical presentation of the covergroup, wherein the graphical presentation include nodes, at least a subset of which correspond to the coverpoints, and wherein the nodes are clustered in the graphical presentation based, at least in part, on the occurrences of the coverpoints during the functional verification of the circuit design.

2. The method of claim 1, further comprising determining, by the computing system, occurrences of coverage crosses in the covergroup based, at least in part, on the results of the functional verification of the circuit design, wherein each of the coverage crosses corresponds to a different plurality of the coverpoints occurring concurrently.

3. The method of claim 2, wherein another subset of the nodes in the graphical presentation of the covergroup corresponds to the coverage crosses, and wherein the nodes are arranged in the graphical presentation of the covergroup based, at least in part, on a connectivity between the coverpoints and the coverage crosses.

4. The method of claim 1, wherein generating the graphical presentation of the covergroup is performed by the computing system with a force-directed graph drawing algorithm.

5. The method of claim 1, further comprising:
    determining, by the computing system, a rank of the coverpoints based, at least in part, on the occurrences of the coverpoints during the functional verification of the circuit design; and
    annunciating, by the computing system, the rank of one of the coverpoints in a corresponding node of the graphical presentation of the covergroup.

6. The method of claim 1, further comprising:
    identifying, by the computing system, at least one node cluster in the graphical presentation of the covergroup to filter; and
    selectively removing, by the computing system, one or more nodes from the selected node cluster in the graphical presentation of the covergroup based, at least in part, on at least one of a coverage of the nodes, a cardinality associated with the nodes, or a distance between the coverpoints corresponding to the nodes.

7. The method of claim 1, wherein performing functional verification on the circuit design describing the electronic device further comprises:
    generating test stimulus to provide to the electronic device modeled in a verification environment based on the circuit design; and
    recording the coverpoints performed by the electronic device in response to the test stimulus.

8. An apparatus comprising at least one computer-readable memory device storing instructions configured to cause one or more processing devices to perform operations comprising:
    identifying results of functional verification performed on a circuit design describing an electronic device;
    determining occurrences of coverpoints within a covergroup based on the results of the functional verification of the circuit design, wherein each coverpoint corresponds to a signal state or a variable value in the circuit design during the functional verification; and generating a graphical presentation of the covergroup, wherein the graphical presentation include nodes, at least a subset of which correspond to the coverpoints, and wherein the nodes are clustered in the graphical presentation based, at least in part, on the occurrences of the coverpoints during the functional verification of the circuit design.

9. The apparatus of claim 8, wherein the instructions are configured to cause one or more processing devices to perform operations further comprising determining occurrences of coverage crosses in the covergroup based, at least in part, on the results of the functional verification of the circuit design, and wherein each of the coverage crosses corresponds to a different plurality of the coverpoints occurring concurrently.

10. The apparatus of claim 9, wherein another subset of the nodes in the graphical presentation of the covergroup corresponds to the coverage crosses, and wherein the nodes are arranged in the graphical presentation of the covergroup based, at least in part, on a connectivity between the coverpoints and the coverage crosses.

11. The apparatus of claim 8, wherein generating the graphical presentation of the covergroup is performed by the computing system with a force-directed graph drawing algorithm.

12. The apparatus of claim 8, wherein the instructions are configured to cause one or more processing devices to perform operations further comprising
determining a rank of the coverpoints based, at least in part, on the occurrences of the coverpoints during the functional verification of the circuit design; and
annunciating the rank of one of the coverpoints in a corresponding node of the graphical presentation of the covergroup.

13. The apparatus of claim 8, wherein the instructions are configured to cause one or more processing devices to perform operations further comprising
identifying at least one node cluster in the graphical presentation of the covergroup to filter; and
selectively removing one or more nodes from the selected node cluster in the graphical presentation of the covergroup based, at least in part, on at least one of a coverage of the nodes, a cardinality associated with the nodes, or a distance between the coverpoints corresponding to the nodes.

14. The apparatus of claim 8, wherein performing functional verification on the circuit design describing the electronic device further comprises:
generating test stimulus to provide to the electronic device modeled in a verification environment based on the circuit design; and
recording the coverpoints performed by the electronic device in response to the test stimulus.

15. A system comprising:
a memory system configured to store computer-executable instructions; and
a computing system, in response to execution of the computer-executable instructions, is configured to:
identify results of functional verification performed on a circuit design describing an electronic device;
determine occurrences of coverpoints within a covergroup based on the results of the functional verification of the circuit design, wherein each coverpoint corresponds to a signal state or a variable value in the circuit design during the functional verification; and
generate a graphical presentation of the covergroup, wherein the graphical presentation include nodes, at least a subset of which correspond to the coverpoints, and wherein the nodes are clustered in the graphical presentation based, at least in part, on the occurrences of the coverpoints during the functional verification of the circuit design.

16. The system of claim 15, wherein the computing system, in response to execution of the computer-executable instructions, is further configured to determine occurrences of coverage crosses in the covergroup based, at least in part, on the results of the functional verification of the circuit design, and wherein each of the coverage crosses corresponds to a different plurality of the coverpoints occurring concurrently.

17. The system of claim 16, wherein another subset of the nodes in the graphical presentation of the covergroup corresponds to the coverage crosses, and wherein the nodes are arranged in the graphical presentation of the covergroup based, at least in part, on a connectivity between the coverpoints and the coverage crosses.

18. The system of claim 15, wherein generating the graphical presentation of the covergroup is performed by the computing system with a force-directed graph drawing algorithm.

19. The system of claim 15, wherein the computing system, in response to execution of the computer-executable instructions, is further configured to
determine a rank of the coverpoints based, at least in part, on the occurrences of the coverpoints during the functional verification of the circuit design; and
annunciate the rank of one of the coverpoints in a corresponding node of the graphical presentation of the covergroup.

20. The system of claim 15, wherein the computing system, in response to execution of the computer-executable instructions, is further configured to:
identify at least one node cluster in the graphical presentation of the covergroup to filter; and
selectively remove one or more nodes from the selected node cluster in the graphical presentation of the covergroup based, at least in part, on at least one of a coverage of the nodes, a cardinality associated with the nodes, or a distance between the coverpoints corresponding to the nodes.

* * * * *